United States Patent [19]
Hertz et al.

[11] Patent Number: 5,418,688
[45] Date of Patent: May 23, 1995

[54] CARDLIKE ELECTRONIC DEVICE

[75] Inventors: Allen D. Hertz, Boca Raton; David A. Tribbey, Boynton Beach; Kenneth Cook, Lake Worth; Arthur L. A. Baker, Greenacres, all of Fla.

[73] Assignee: Motorola, Inc., Schaumburg, Ill.

[21] Appl. No.: 38,423

[22] Filed: Mar. 29, 1993

[51] Int. Cl.[6] .............................................. H05K 1/14
[52] U.S. Cl. .................................. 361/790; 361/761; 361/792; 257/700; 257/779; 174/260; 174/261; 174/263
[58] Field of Search ............... 361/735, 737, 790, 792, 361/795, 760-761; 174/260, 263, 52.1, 52.4; 257/773, 779-784, 786, 700

[56] References Cited

U.S. PATENT DOCUMENTS

| | | |
|---|---|---|
| 4,288,841 | 9/1981 | Gogal .................................. 361/792 |
| 4,558,427 | 12/1985 | Takeuchi et al. . |
| 4,935,745 | 6/1990 | Mori et al. . |
| 5,054,120 | 10/1991 | Ushiyama et al. . |
| 5,079,559 | 1/1992 | Umetsu . |

OTHER PUBLICATIONS

Braslaw, IBM Technical Disclosure Bulletin, vol. 20, No. 11A, Apr. 1978.

*Primary Examiner*—Bot Ledynh
*Attorney, Agent, or Firm*—Philip P. Macnak; John H. Moore

[57] ABSTRACT

An electronic device (100) comprises a first substrate (102) having a first circuit pattern disposed thereon which is selectively processed to provide pretinned connection pads (108, 116, 124, 132, 140) for connection to at least one electronic component (142) and a second circuit pattern disposed on a second substrate (104). The second circuit pattern disposed on the second substrate (104) is selectively processed to further provide pretinned connection pads (110, 118, 126) for connection to the first circuit pattern, and the second substrate (104) further has relief provided within a portion thereof to position the at least one electronic component (142) with respect to the pretinned connection pads (108, 116, 124, 132, 140) on the first circuit pattern. The pretinned connection pads (108, 116, 124, 132, 140, 110, 118, 126) are processed using a low residue fluxing agent to enable processing of the first (102) and second (104) substrates and the at least one electronic component (142) in a single operation through an envelope heating device without a requirement for cleaning after reflow.

18 Claims, 4 Drawing Sheets

CARDLIKE ELECTRONIC DEVICE

BACKGROUND OF THE INVENTION

1. Field of the Invention

The present invention relates generally to the field of electronic devices, and more particularly to cardlike electronic devices and a method for making the same.

2. Description of the Prior Art

Cardlike electronic devices, such as credit card calculators, personal organizers and pagers are gaining wide acceptance because of the convenience they offer in terms of their small size. Manufacturing processes required to construct such devices have generally relied on tried and true manufacturing processes developed for much larger, portable electronic devices. Credit card pagers, for example, today utilize conventional reflow solder technologies, wherein solder paste is screened onto the printed circuit board, the components are placed, and the assembly is finally reflow soldered. Following the reflow solder process, the finished assembly is then tested and placed in a housing which provides both protection to the electronic devices and is esthetically pleasing.

In order to insure the reliability of such cardlike electronic devices, various processes have been developed to ruggedize the housing. One such process is to insert mold a metal plate within a portion of the housing, such as one used for a credit card pager. The metal plate adds stiffness to the housing, thereby improving the ruggedness of the design. An alternative process, such as used for cardlike calculators utilizes thin sheetlike substrates which are assembled in layers joined using adhesives which are cured in a hot pressing process. Such a process is very time consuming, in that each layer is assembled to the previously assembled layers in a sequence of steps which require sufficient time to insure the adhesive is cured prior to the next step. It is also difficult to insure that the adhesive is completely cured before the next step is undertaken. The process is further complicated through the use of solder pastes, required to attach the various electronic components.

What is needed is a process for assembling a cardlike electronic device which does not require a sequence of time consuming steps, and which does not rely on the use of solder printing or adhesives to enable assembly of the device.

SUMMARY OF THE INVENTION

In accordance with a first aspect of the present invention, an electronic device comprises a first substrate having a first circuit pattern disposed thereon which is selectively processed to provide pretinned connection pads for connection to at least one electronic component and a second circuit pattern disposed on a second substrate. The second circuit pattern is selectively processed to further provide pretinned connection pads for connection to the first circuit pattern, and the second substrate further has relief provided within a portion thereof to position the at least one electronic component with respect to the pretinned connection pads on the first circuit pattern. The pretinned connection pads are processed using a low residue fluxing agent to enable processing of the first and second substrates and the at least one electronic component in a single operation through an envelope heating device without a requirement for cleaning after reflow.

In accordance with a second aspect of the present invention, the second substrate described above has first and second surfaces, the second surface having the second circuit pattern disposed thereon and the first surface having a third circuit pattern disposed thereon, the second circuit pattern being selectively processed to provide pretinned connection pads for connection to the first circuit pattern, and the third circuit pattern also being selectively processed to provide pretinned connection pads for connection to a fourth circuit pattern. At least a third substrate is provided which has first and second surfaces, the first surface having the fourth circuit pattern disposed thereon, the fourth circuit pattern is selectively processed to provide pretinned connection pads for connection to the third circuit pattern. The pretinned connection pads are processed using a low residue fluxing agent to enable processing of the first, second and third substrates and the at least one electronic component in a single operation through an envelope heating device without a requirement for cleaning after reflow.

DESCRIPTION OF THE PREFERRED EMBODIMENTS

Figure 1:
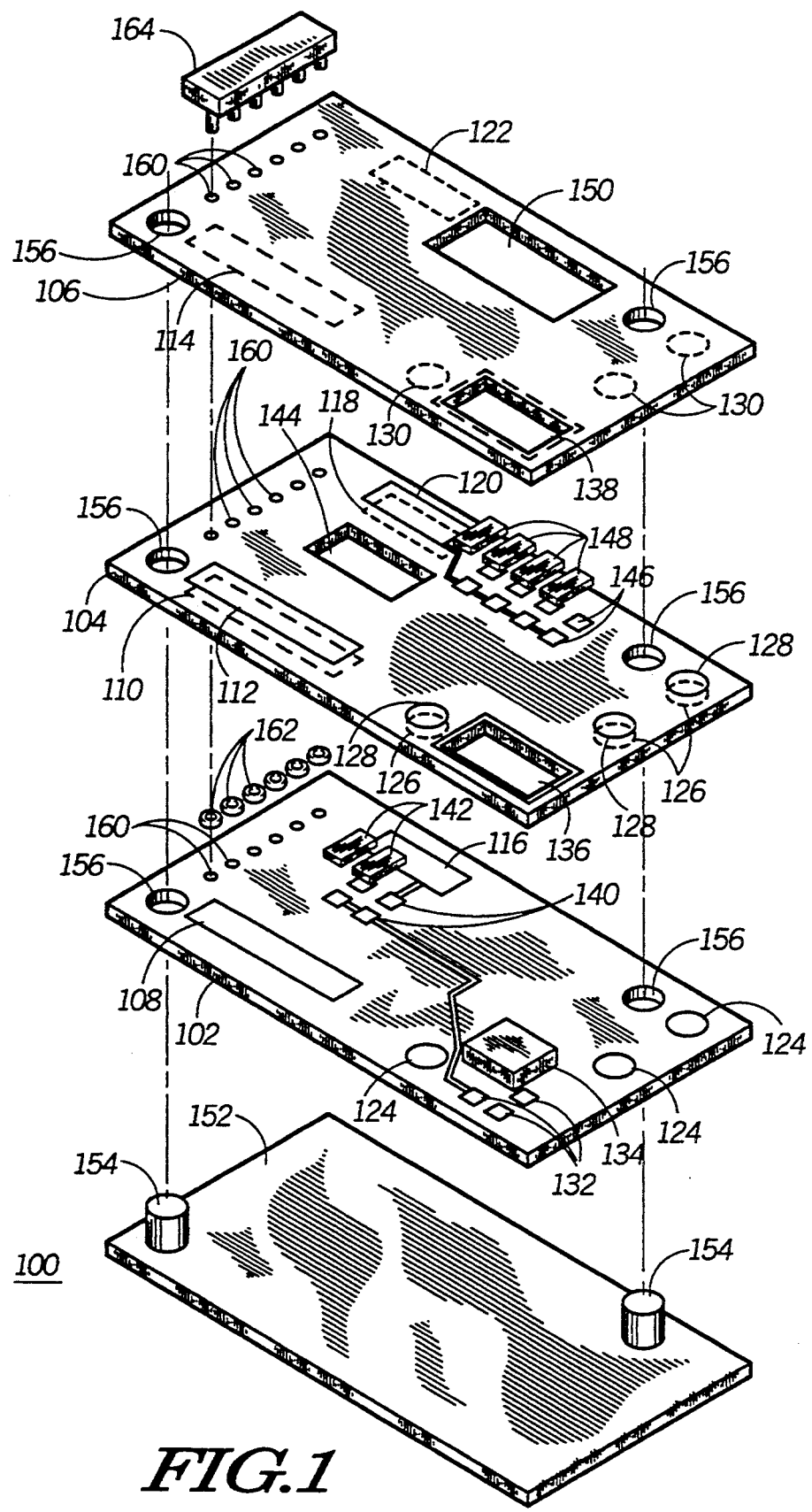
FIG. 1 is an isometric exploded view of the cardlike electronic device in accordance with the preferred embodiment of the present invention.

FIG. 1 is an isometric exploded view of the cardlike electronic device 100 in accordance with the preferred embodiment of the present invention. The cardlike electronic device comprises a first substrate 102 having a first circuit pattern including printed circuit pads 108, 116, 124, 132, and 140 disposed on a first surface thereof; a second substrate 104 having a second circuit pattern including printed circuit pads 110, 118 and 126 disposed on a first surface thereof, and a third printed circuit pattern including printed circuit pads 112, 120, 128 and 146 disposed on a second surface thereof. A third substrate 106 is also shown having a fourth printed circuit pattern including printed circuit pads 114, 122, and 130 disposed on a first surface thereof. It will be appreciated that the first, second, third, and fourth circuit patterns depict representative circuit patterns, and that the actual circuit patterns are a function of the actual electronic device being implemented. The three substrates 102, 104 and 106 are preferably manufactured from a composite/polymer material such as a glass epoxy or a polyimide printed circuit board material, although it will be appreciated that other substrate materials can be utilized as well. The printed circuit patterns are generated using any of a number of well known printed circuit manufacturing processes, including, but not limited to subtractive etching processes, additive deposition processes or screened conductor processes. Solder resists can be applied to the surfaces of the printed circuit boards, as will be described in further detail below, to prevent shorting between printed circuit patterns on adjacent circuit substrates, and are further used to improve device reliability by insulating the conductive circuit patterns, such as that of copper, from contamination and oxidation. The electronic pads are pretinned during manufacture of the circuit substrate using a screened on solder paste, such as a tin/lead/silver solder paste, although it will be appreciated that other reflow soldering materials can be utilized as well. The solder paste is then reflowed using a solder reflow oven, or a laser solder deposition process, although it will be appreciated that other solder pretinning processes can be utilized as well. The printed circuit patterns provide electrical interconnection between electronic components as well as mechanical interconnection between circuit substrates.

A variety of electrical components 142 and 148 can be assembled to the circuit substrates, such as chip or leaded capacitors, resistors or inductors. Other electrical components 134, such as leaded semiconductor devices or devices mounted into chip carriers can also be assembled as well. Cutouts 136, 138, 144 and 150 provide clearance for the electrical components and are also used to position the components on their associated printed circuit pads. Plated through holes 160 can be provided to assemble leaded components, as a connector 164. When leaded components are assembled, additional solder 162 can be provided in the form of solder paste or solder preforms, such as preformed solder rings. Tooling holes 156 are provided in each of the circuit substrates 102, 104, and 106 and are used to align each of the circuit substrates using an alignment fixture 152 which includes posts 154 which provide engagement with the tooling holes. It will be appreciated that other methods for aligning the circuit substrates other than with the use of aligning fixture can be utilized as well, and these methods include, but are not limited to, alignment techniques such as described in U.S. patent application Ser. No. 08/008019, filed Jan. 22, 1993 by Hertz et al., entitled "Self Aligning Surface Mount Electrical Component" which is assigned to the assignee of the present invention, and which are incorporated by reference herein.

Unlike the prior art assembly procedures for cardlike electronic devices, which require the assembly in a sequence of steps to allow for solder or adhesive printing and component assembly, the assembly of the cardlike electronic device in accordance with the preferred embodiment of the present invention is greatly simplified. Since each of the printed circuit patterns and electrical components are pretinned, in the preferred embodiment of the present invention, assembly requires only stacking sequentially each of the circuit substrates onto the alignment fixture, and appropriately positioning the electrical components as the circuit substrates are stacked. Once all circuit substrates and components have been loaded onto the alignment fixture, the fixture is passed through an envelope heating device, such as a forced convection solder reflow oven, or a solder reflow oven utilizing an additional infrared heating element.

While three circuit substrates are shown in FIG. 1, it will be appreciated that any number of circuit substrates can be utilized. Furthermore, the uppermost and lowermost circuit substrates can include a copper foil pattern, or screened conductor pattern which can function to provide both electromagnetic and electrostatic shielding for the electronic circuit enclosed there between, such as shown and described in FIG. 7 below, or to provide shielding between circuit substrate layers, such as shown and described in FIG. 8 below. Following the reflow process, screened laminate labels, such as manufactured from a polycarbonate plastic can be affixed to the uppermost and lowermost surfaces, to complete the assembly process, thereby marking the electronic device.

Figure 2:
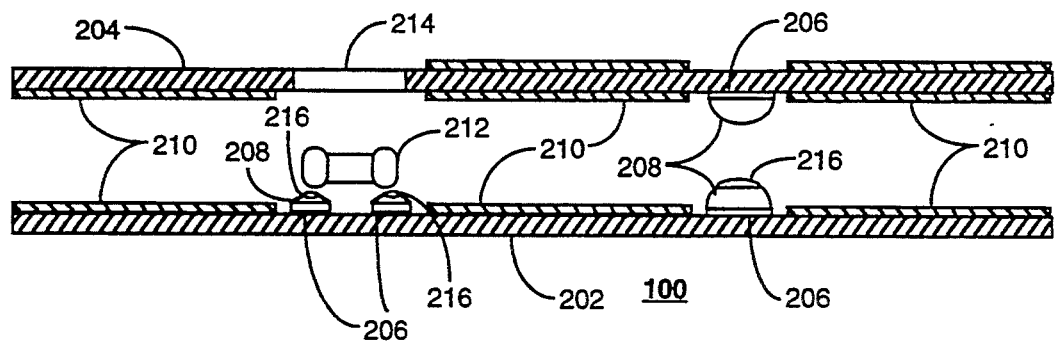
FIG. 2 is a sectional view of the cardlike electronic device in accordance with the preferred embodiment of the present invention.

FIG. 2 is a sectional view of the cardlike electronic device 100 in accordance with the preferred embodiment of the present invention. As shown, printed circuit patterns 206 are pretinned with solder 208 to enable electrical contact between electrical components 212 and the adjacent circuit substrate. Flux 216 can be applied to the pretinned solder areas 208 to temporarily locate the components 212 to the solder pads 208 as will be described further below. A solder resist 210 can be provided where required to prevent shorting between printed circuit patterns on adjacent circuit substrates 202 and 204. It will be appreciated that a thin substrate which provides electrical connection between circuit patterns on adjacent substrates can be interposed between the adjacent substrates to provide the electrical isolation as well, such as shown and described in FIG. 6 below.

Figure 3:
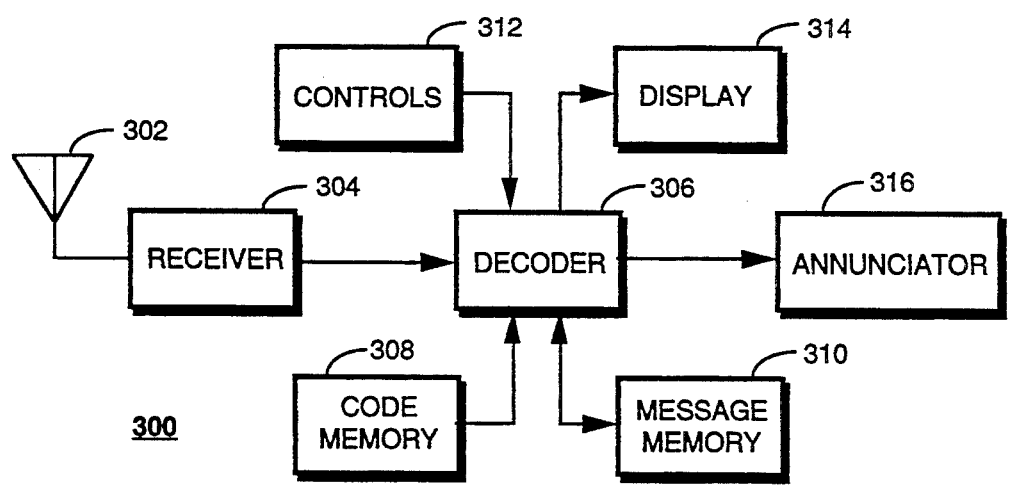
FIG. 3 is an electrical block diagram of a communication receiver suitable for assembly in accordance with the preferred embodiment of the present invention.

FIG. 3 is an electrical block diagram of a communication receiver 300 suitable for assembly in accordance with the preferred embodiment of the present invention. The communication receiver 300 includes an antenna 302 for intercepting transmitted signals, such as selective call paging signals. The intercepted paging signals are coupled to the input of a receiver 304 which processes the signals in a manner well known to one of ordinary skill in the art, providing at the receiver output analog audio information, or a stream of digital data, depending on the format of the selective call paging signals being transmitted. The information provided at the receiver output is coupled to a decoder 306 which processes the analog or digital information in a manner well known to one of ordinary skill in the art, comparing the received information with address information stored in a code memory 308, and when the received information matches the address information stored in the code memory 308, the decoder 306 generates an alert signal which is coupled to an annunciator 316 alerting the communication receiver user of the receipt of a message. Any message information, such as numeric or alphanumeric messages are then stored in a message memory 310. The annunciator 316 can be silenced or a message can be recalled from the message memory 310 using controls 312, which also control the display of the stored message on a display 314.

Figure 4:
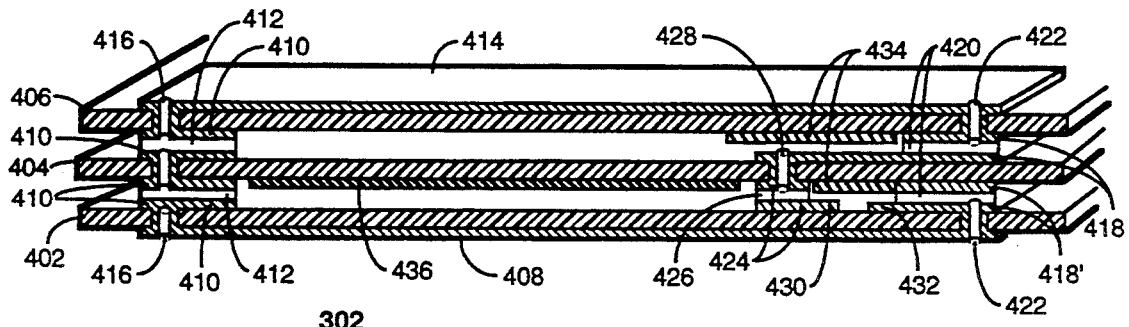
FIG. 4 is a sectional view of an antenna suitable for use with the communication receiver of FIG. 3 in accordance with the preferred embodiment of the present invention.

FIG. 4 is a sectional view of one embodiment of an antenna 302 suitable for use with the communication receiver 300 of FIG. 3 in accordance with the preferred embodiment of the present invention. As shown, the cardlike receiving device is constructed with three circuit substrates, a lower 402, an intermediate 404 and an upper 406. A portion of the antenna is a first conductor 408 etched on the lower circuit substrate 402, and a second conductor 414 etched on the upper circuit substrate 406. Intermediate conductors 410 are etched onto the lower, intermediate and upper circuit substrates, pretinned with solder 410, and to conductors on the opposite circuit substrate surface via plated through holes 416. When reflowed, the pretinned solder 410 completes the electrical connection between the first conductor 408 and the second conductor 414. While conductor 414 is shown to be long and narrow, it will be appreciated that the conductor can cover the entire top surface of upper circuit substrate 406 in a manner similar to that shown in FIG. 7, and it will further be appreciated that the same is true for conductor 408.

Intermediate conductors 418 and 418' are etched onto the lower, intermediate and upper circuit substrates, pretinned with solder 420, and coupled to conductors on the opposite circuit substrate surface via plated through holes 422. Wheat reflowed, the pretinned solder 420 provides mechanical coupling between conductors 418' on the lower and intermediate circuit substrates. The first conductor 408 is coupled via a plated through hole 422 to conductor 418', and provides one electrical input 432 to the receiver. When reflowed, the pretinned solder 420 also provides electrical and mechanical coupling between conductors 418 on the intermediate and upper circuit substrates. The second conductor 414 is coupled via a plated through hole 422 to conductor 418, and is further coupled via plated through hole 428 to conductor 424, and provides a second electrical input 430 to the receiver.

In summary, the process of assembling a cardlike receiver in accordance with the preferred embodiment of the present invention enables a receiver to be built which includes an integral loop antenna formed advantageously to maximize the size of the loop antenna as described above.

Figure 5:
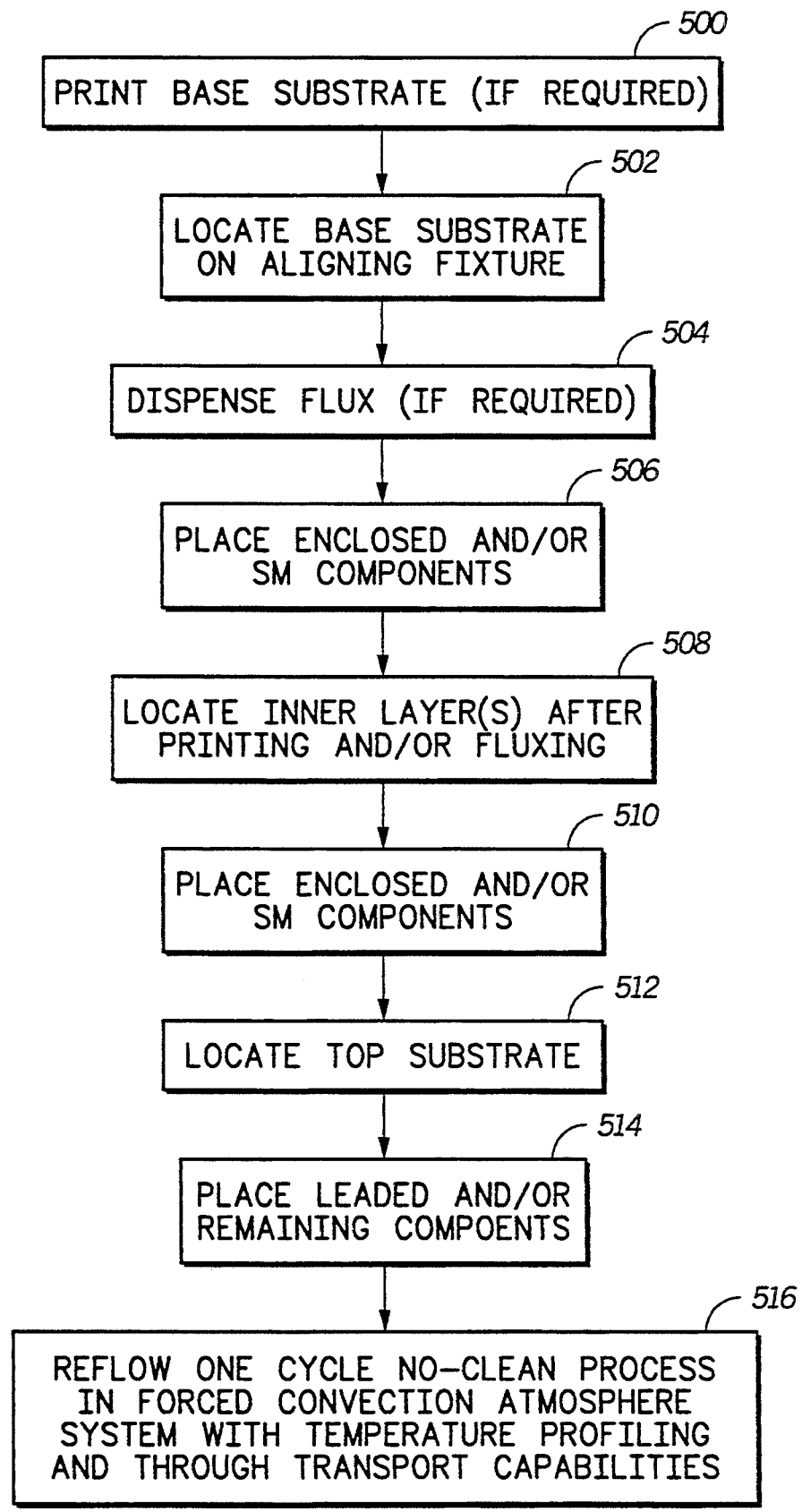
FIG. 5 is a flow chart depicting the method of assembling the cardlike electronic device in accordance with the preferred embodiment of the present invention.

FIG. 5 is a flow chart depicting the method of assembling the cardlike electronic device in accordance with the preferred embodiment of the present invention. The lower, or base circuit substrate is solder printed, such as required for leaded components, step 500, and located on the aligning fixture, step 502, otherwise solder printing is not required. Flux can then be dispensed over the circuit pads which are to be reflow soldered, step 504. The flux is not absolutely necessary, however, the flux provides the additional function of retaining the circuit components onto the circuit pads to which they are to be soldered. The enclosed components, such as leaded components, chip carriers, and surface mount (SM) components to be reflowed to the base circuit substrate, are placed on the base substrate, step 506. The inner circuit substrate is then placed on the aligning fixture, step 508, after being suitably fluxed or solder printed for leaded components. The enclosed components, such as chip carriers, and surface mount (SM) components to be reflowed to the inner circuit substrate, are placed on the inner circuit substrate, step 510, after which the top circuit substrate is placed on the aligning fixture, step 512. Any leaded components or remaining surface mount components are then positioned on the upper circuit substrate, step 514. Following the complete assembly of all components, the aligning fixture is loaded onto a belt to reflow the circuit substrates and components together in a single operation. A no clean solder reflow process 516 which uses a low residue flux, such as Kester 247B manufactured by Kester Solder Pastes, a Division of The Litton Corporation of Des Plaines, Ill. in combination with a forced convection reflow system, such as the BTU model TRS14 solder reflow system manufactured by BTU International of North Billerica, Mass., which is capable of using a variety of atmospheric gas envelopes is utilized in the preferred embodiment of the present invention. The atmospheric gas envelopes can include reducing, inert or reactive gas atmospheres, such as provided using formic acid, nitrogen or a nitrogen-hydrogen mixture (such as 85% $N_2$ and 15% $H_2$), respectively. The reflow oven is suitably profiled to insure liquification of the pretinned solder pads and components, especially those positioned within the inner circuit substrate. As previously described, the aligning fixture maintains the positions of all circuit substrates during the reflow process, and minimizes the need for further processing of the cardlike electronic device.

Figure 6:
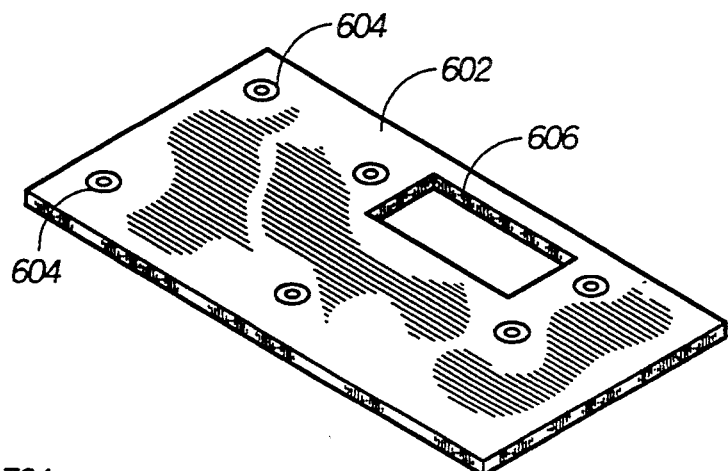
FIG. 6 is an isometric view of a circuit substrate utilized in the assembly of the cardlike electronic device in accordance with a first alternate embodiment of the present invention.

FIG. 6 is an isometric view of a circuit substrate utilized in the assembly of the cardlike electronic device in accordance with a first alternate embodiment of the present invention. As shown, the circuit substrate 602 can provide isolation between two circuit substrates, each having printed circuit patterns disposed thereon. Electrical coupling is provided by plated through holes 604. Apertures, or cutouts 606 can be provided to provide clearance for reflowed components. Additional pads, such as pads 126 and 130 shown in FIG. 1 can be positioned about the substrate to provide additional mechanical coupling between circuit substrates as well.

Figure 7:
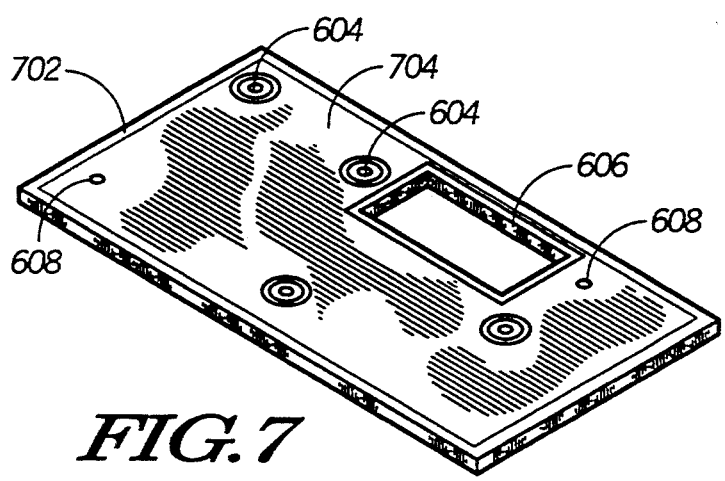
FIG. 7 is an isometric view of a circuit substrate providing an integral electromagnetic shield utilized in the assembly of the cardlike electronic device in accordance with the first alternate embodiment of the present invention.

FIG. 7 is an isometric view of a circuit substrate providing an integral electromagnetic shield utilized in the assembly of the cardlike electronic device in accordance with the first alternate embodiment of the present invention. As shown, the circuit substrate 702 can include a conductive pattern 704 which provide electromagnetic isolation between two circuit substrates, each having printed circuit patterns disposed thereon. Electrical coupling is provided by plated through holes 604 between circuit substrates, and other plated thru holes 608 provide electrical coupling to the conductive circuit pattern. Apertures, or cutouts 606 can be provided to provide clearance for reflowed components. Additional pads, such as pads 126 and 130 shown in FIG. 1 can be positioned about the substrate to provide additional mechanical coupling between circuit substrates as well.

Figure 8:
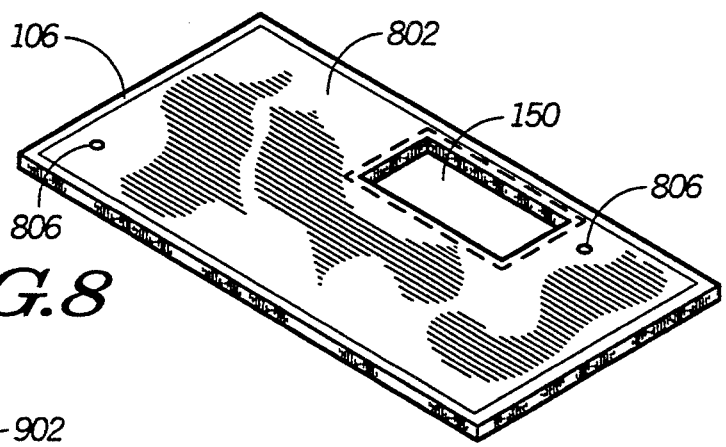
FIG. 8 is an isometric view of a circuit substrate providing an electromagnetic shield utilized in the assembly of the cardlike electronic device in accordance with a second alternate embodiment of the present invention.

FIG. 8 is an isometric view of a circuit substrate providing an electromagnetic shield utilized in the assembly of the cardlike electronic device in accordance with a second alternate embodiment of the present invention. As shown, the circuit substrate 106 can provide electromagnetic isolation for the electrical device. Electrical coupling is provided by plated through holes 806 to a circuit pattern 802 covering substantially the entire surface of circuit substrate 106, as shown. Apertures, or cutouts 150 can be provided to provide clearance for reflowed components, or clearance for such components as LCD displays. Additional pads, such as pads 126 shown in FIG. I can be positioned about the bottom of the substrate to provide mechanical coupling between circuit substrates. It will be appreciated that where an aperture 150 is provided within the circuit substrate, the aperture can be formed using a routing or other similar process, thereby allowing the aperture 804 to be edge plated during the circuit substrate manufacturing process. Such plated apertures can form completely shielded enclosures for components requiring complete electromagnetic isolation during the reflow process described above.

Figure 9:
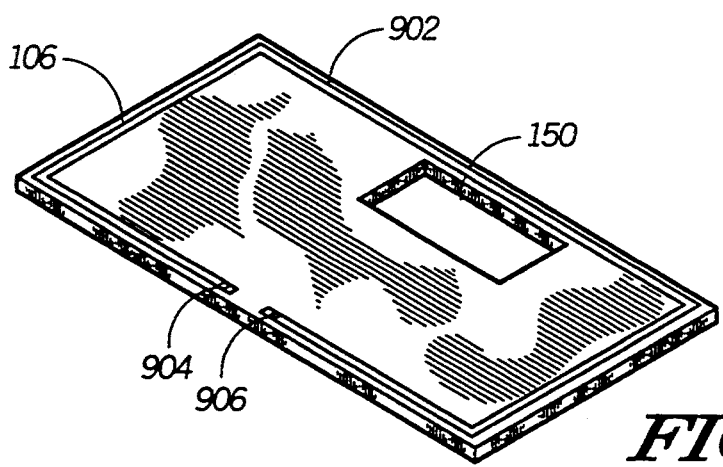
FIG. 9 is an isometric view of a circuit substrate including an integral antenna utilized in the assembly of the cardlike electronic device in accordance with a third alternate embodiment of the present invention.

FIG. 9 is an isometric view of a circuit substrate including an integral antenna utilized in the assembly of the cardlike electronic device in accordance with a third alternate embodiment of the present invention. As shown, the circuit substrate 106 includes a circuit pattern 902 which provides a loop antenna. Plated thru holes 904 and 906 provide electrical coupling to the input of the receiver. Apertures, or cutouts 150 can be provided to provide clearance for reflowed components, or clearance for such components as LCD displays. Additional pads, such as pads 126 shown in FIG. I can be positioned about the bottom of the substrate to provide mechanical coupling between circuit substrates.

It will be appreciated that while several particular printed circuit patterns have been described disposed on the uppermost and lowermost circuit substrates, other printed circuit patterns, such as a finger pattern used to form an edge connector can be disposed thereon as well.

In summary, a cardlike electronic device, such as a communication receiver is described above together with a process for assembling the cardlike electronic device in a single reflow processing step. Both leadless and leaded components can be utilized. Solder screening is eliminated from the process, except when required by certain of the leaded electronic components. Furthermore, no adhesives are required, since the reflowed solder provides electrical connections between circuit substrates and components, and also provides mechanical coupling between circuit substrates. The outer circuit substrates can be pre-printed with identifying information, such that the cardlike electronic device when removed from the aligning fixture would be completed for shipment. Where it is desirable to cover the tooling holes, paper or plastic laminate labels can be affixed to the upper and lower surfaces to provide both product identifying information, and to cover the tooling holes.

We claim:

1. An electronic device comprising:
   a first substrate, having a first circuit pattern disposed thereon, said first circuit pattern being selectively processed to provide pretinned connection pads for connection to at least one electronic component and a second circuit pattern disposed on a second substrate,
   said second substrate, having said second circuit pattern disposed thereon, said second circuit pattern being selectively processed to further provide pretinned connection pads for connection to said first circuit pattern, and said second substrate further having relief provided within a portion thereof to position said at least one electronic component with respect to said pretinned connection pads on said first circuit pattern,
   said pretinned connection pads being processed using a low residue fluxing agent to enable processing of said first and second substrates and said at least one electronic component in a single operation through an envelope heating device without a requirement for cleaning after reflow.

2. The electronic device according to claim 1, wherein said envelope heating device is a forced convection reflow oven.

3. The electronic device according to claim 2, wherein said envelope heating device utilizes a gas atmosphere selected from a group of gas atmospheres consisting of reducing, inert and reactive gas atmospheres.

4. The electronic device according to claim 1, wherein a portion of said first and second circuit patterns provide an electrical connection between said first and second circuit patterns.

5. The electronic device according to claim 1, wherein a portion of said first and second circuit patterns provide a mechanical connection between said first and second substrates.

6. The electronic device according to claim 1, wherein said first and second substrates include means for aligning said first circuit pattern with said second circuit pattern prior to processing said first and second substrates through said envelope heating device.

7. An electronic device comprising:
   a first substrate, having first and second surfaces, said first surface having a first circuit pattern disposed thereon, said first circuit pattern being selectively processed to provide pretinned connection pads for connection to at least one electronic component and a second circuit pattern;
   a second substrate, having first and second surfaces, said second surface having said second circuit pattern disposed thereon and said first surface having a third circuit pattern disposed thereon, said second circuit pattern being selectively processed to provide pretinned connection pads for connection to said first circuit pattern, and said third circuit pattern also being selectively processed to provide pretinned connection pads for connection to a fourth circuit pattern, said second substrate further having relief provided within a portion thereof to position said at least one electronic component with respect to said first circuit pattern; and
   at least a third substrate, having first and second surfaces, said first surface having said fourth circuit pattern disposed thereon, said fourth circuit pattern being selectively processed to provide pretinned connection pads for connection to said third circuit pattern,
   said pretinned connection pads being processed using a low residue fluxing agent to enable processing of said first, second and third substrates and said at least one electronic component in a single operation through an envelope heating device without a requirement for cleaning after reflow.

8. The electronic device according to claim 7, wherein said electronic device is a communication receiver.

9. The electronic device according to claim 8 wherein said first and third substrates include a circuit pattern disposed thereon which form first and second elements of a loop antenna.

10. The electronic device according to claim 7, wherein said first surface of said first substrate has at least a fifth circuit pattern disposed thereon.

11. The electronic device according to claim 10, wherein said at least fifth circuit pattern provides a portion of an electromagnetic shield.

12. The electronic device according to claim 7, wherein said first, second, and at least third substrates includes means for aligning said at least first circuit pattern with said second circuit pattern, and said third circuit pattern with said at least fourth circuit pattern, prior to processing said first, second, and at least third substrates through the envelope heating device.

13. The electronic device according to claim 7, wherein said second surface of said third substrate has at least a sixth circuit pattern disposed thereon.

14. The electronic device according to claim 13, wherein said at least sixth circuit pattern provides a portion of an electromagnetic shield.

15. The electronic device according to claim 7, wherein said envelope heating device is a forced convection reflow oven.

16. The electronic device according to claim 7, wherein said selectively processed first, second, third and fourth circuit patterns are processed to provide pre-tinned solder pad areas.

17. The electronic device according to claim 7, wherein a portion of said first and second circuit patterns provide electrical coupling between said first and second circuit patterns, and further wherein a portion of said third and fourth circuit patterns provide electrical coupling between said third and fourth circuit patterns.

18. The electronic device according to claim 7, wherein a portion of said first and second circuit patterns provide mechanical coupling between said first and second substrates, and further wherein a portion of said third and fourth circuit patterns provide electrical coupling between said second and third substrates.

* * * * *